(12) United States Patent
Nguyen

(10) Patent No.: US 7,411,426 B2
(45) Date of Patent: Aug. 12, 2008

(54) PHASE DETECTOR FOR RZ

(75) Inventor: Nam Duc Nguyen, San Jose, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 11/429,462

(22) Filed: May 5, 2006

(65) Prior Publication Data

US 2007/0035333 A1 Feb. 15, 2007

Related U.S. Application Data

(63) Continuation-in-part of application No. 10/896,372, filed on Jul. 20, 2004.

(51) Int. Cl.
*H03L 7/00* (2006.01)
(52) U.S. Cl. .................. 327/3; 327/2; 327/17
(58) Field of Classification Search ............. 327/1–3, 327/16, 17, 162, 163, 147, 156
See application file for complete search history.

(56) References Cited

U.S. PATENT DOCUMENTS

| | | | | |
|---|---|---|---|---|
| 4,105,947 A * | 8/1978 | Crowley | ............. | 331/1 A |
| 4,277,754 A | 7/1981 | Minakuchi | ............. | 327/12 |
| 5,027,085 A | 6/1991 | DeVito | ............. | 331/1 A |
| 5,266,851 A | 11/1993 | Nukui | ............. | 327/3 |
| 5,610,954 A | 3/1997 | Miyashita et al. | ............. | 375/375 |
| 5,736,872 A * | 4/1998 | Sharma et al. | ............. | 327/3 |
| 5,936,430 A | 8/1999 | Patterson | ............. | 327/12 |
| 6,157,218 A | 12/2000 | Chen | ............. | 327/7 |
| 6,225,831 B1 | 5/2001 | Dalmia et al. | ............. | 327/12 |
| 6,324,236 B1 | 11/2001 | Bladh | ............. | 375/375 |
| 6,377,081 B1 | 4/2002 | Tateyama | ............. | 327/12 |
| 6,392,457 B1 | 5/2002 | Ransijn | ............. | 327/156 |
| 6,392,494 B2 * | 5/2002 | Takeyabu et al. | ............. | 331/11 |
| 6,404,258 B2 | 6/2002 | Ooishi | ............. | 327/278 |
| 6,496,554 B1 * | 12/2002 | Ahn | ............. | 375/376 |
| 6,577,157 B1 * | 6/2003 | Cheung et al. | ............. | 326/38 |
| 6,590,427 B2 | 7/2003 | Murphy et al. | ............. | 327/12 |
| 6,801,094 B2 * | 10/2004 | Aoki et al. | ............. | 331/25 |
| 6,831,485 B2 | 12/2004 | Lee et al. | ............. | 327/2 |

* cited by examiner

*Primary Examiner*—N. Drew Richards
*Assistant Examiner*—Hai L. Nguyen
(74) *Attorney, Agent, or Firm*—Townsend and Townsend and Crew LLP

(57) ABSTRACT

A phase detector is adapted to receive first and second signals and generate third and fourth signals representative of the difference between the phases of the first and second signals. The phase detector assert the third signal in response to the assertion of the first signal and unasserts the third signal in response to the assertion of the second signal. The phase detector asserts the fourth signal in response to the assertion of the third signal and unasserts the fourth signal in response to unassertion of the first signal. The phase detector may include combinatorial logic gates, thereby to generate the third and fourth signals in response to logic levels of the first and second signals. The phase detector may include sequential logic gates, thereby to generate the third and fourth signals in response to transitions of the first and second signals.

2 Claims, 7 Drawing Sheets

PHASE DETECTOR FOR RZ

CROSS-REFERENCES TO RELATED APPLICATIONS

The present application is a continuation in-part of and claims priority under 35 U.S.C. 120 from application Ser. No. 10/896,372 filed Jul. 20, 2004, entitled "Phase Detector", the content of which is incorporated herein by reference in its entirety.

FIELD OF THE INVENTION

The present invention relates to electronic circuits, and more particularly to phase detectors adapted to operate with return-to-zero (RZ) or pulse position modulation data in clock and data recovery (CDR) system.

BACKGROUND OF THE INVENTION

The increasing speed with which multiple types of data, such as text, audio and video, are transported over existing communication networks has brought to the fore the reliability with which such data transportation is carried out. In accordance with one conventional method, to ensure reliable data transfer, the data is first encoded with a reference clock signal at the transmitting end of the network to generate a composite signal. Thereafter, the composite signal is transmitted over the network to the receiving end. At the receiving end, the data and clock signals are recovered from the composite signal to ensure that the data and clock signals remain synchronous with respect to each other.

The clock and data recovery (CDR) is typically carried out, for example, by a phase locked loop (PLL). In operation, a phase locked loop maintains a fixed relationship between the phase and frequency of the signal it receives and those of the signal it generates. A phase-locked loop often includes a phase detector (PD) that receives a pair of signals, and in response, generates a pair of output signals representative of the difference between the phases of the two received signals.

One widely known phase detector, referred to as Hogge phase detector, and which can only rely on the non-return to zero (NRZ) or pulse width modulation (PWM) property of data to re-time the input data at the optimal sampling point is shown in FIG. 1. Phase detector (PD) 50 requires that the duty cycle distortion of the recovered clock be kept at minimum. The operation of PD 50 is described further below.

A timing diagram with the clock aligned nearly perfectly aligned to the input data transitions is shown in FIG. 2 for a NRZ or PWM data stream. The input NRZ data stream signal is provided to PD 50 on data signal line labeled Rdata, which is applied to the input terminal D of flip-flop 12. The output QN1 of flip-flop 12 is supplied to the input terminal D of flip-flop 14.

Clock signal Rclk is applied to the input clock terminal CP of flip-flop 12, and the inverse of clock signal Rclk is applied to the input clock terminal of flip-flop 14. The input and output of the flip-flop 12 are provided to an exclusive-OR gate 24 to provide signal P_UP signal. The input and output of the flip-flop 14 are provided to a second exclusive-OR gate 26, to provide signal P_DN. Signals P_UP and P_DN are provided to a charge pump (not shown).

As can be seen from the block diagram of FIG. 1 and the timing diagram of FIG. 2, the P_UP pulses are generated during the time interval between data transitions and the next rising edge of the clock. Every P_UP pulse generates a P_DN pulse with a fixed width of half of the clock period. Ideally the width of the P_UP and P_DN pulses should be equal to half of the clock period. When the clock leads or lags from this ideal position, the P_UP pulse becomes smaller or larger than the P_DN pulse, respectively. The P_UP and P_DN pulses are fed to the charge pump and loop-filter which are part of a phase-locked loop (PLL) (not shown). The difference between the pulse width of the signals P_UP and P_DN is processed and delivered as a feedback signal to control the frequency of the oscillator in the PLL When the clock is aligned nearly perfectly to the input data transitions, the difference between the pulse widths of P_UP and P_DN is equal to nearly zero, and the PLL is in a phase-locked condition. It is seen that the sampling point of the data is optimal since the sampling (rising) edge of the clock is located near the center of the data windows, thus providing the maximum noise margin. Referring to FIG. 2, it is seen that each NRZ of data RDATA pulse provides two P_UP signals and two P_DN signals, resulting in two ramp-up and ramp-down transitions of the loop filter voltage, as shown at the bottom of FIG. 2.

FIG. 3 illustrates what happens if RZ or PPM type data (the pulse width of the signal could be much smaller or much bigger than one period of the clock) is used for the input RDATA signal shown at the top of FIG. 3. As can be seen, since the clock rising edge 32 is aligned with the falling edge 34 of the RZ data, a misalignment may result in the one pulse not being sampled. Accordingly, PD 50 is very susceptible to noise for RZ data and is also not suitable for RZ or Pulse Position Modulation (PPM) data format used in the magnetic recording technology or the communication technology.

FIG. 4 is a simplified block diagram of a tri-wave phase detector 100, as known in the prior art. Tri-wave phase detector 100 is shown as including three flip-flops and three XOR gates. Tri-wave detector 100 provides a reduced sensitivity to data transition density. However, tri-wave detector 100 is more sensitive to duty cycle distortion in the clock signal than is Hogge's phase detector and it is also more complex than Hogge's PD.

FIG. 5 is a simplified block diagram of a modified tri-wave phase detector 150, as known in the prior art. Modified tri-wave phase detector 150 uses two distinct down-integration intervals clocked on opposite edges of the clock, rather than a single down-integration of twice the strength clocked on a single edge. This enables tri-wave phase detector 150 to have a relatively improved duty cycle performance compared to tri-wave phase detector 100. However, phase detectors that are based on Hogge (both tri-wave phase detector 100 as well as modified tri-wave phase detector 150) do not function properly with RZ data stream. Moreover, the center offsets of both these detectors are dependent on the duty cycle of the clock signal CLK.

U.S. Pat. No. 6,324,236 also describe examples of different circuits adapted to detect the phase of a RZ data signal. However, the circuits disclosed in this patent utilize the pulse width of the clock and hence their performance suffers from the clock duty cycle distortion. Moreover, they cannot function properly if the pulse width of the RDATA is greater than one period of the clock.

BRIEF SUMMARY OF THE INVENTION

A phase detector in accordance with the present invention receives first and second signals and, in response, generates third and fourth signals representative of the difference between the phases of the first and second signals. The phase detector asserts the third signal in response to the assertion of the first signal and unasserts the third signal in response to the assertion of the second signal. The phase detector asserts the fourth signal in response to the assertion of the second signal and unasserts the fourth signal in response to unassertion of the first signal. The first and second signals represent data and clock signals. The phase detector in accordance with the present invention is adapted to operate even if the pulse width is greater than twice the clock period.

In some embodiments, the phase detector includes combinatorial logic gates, such as AND gates. In these embodiments, the phase detector generates the third and fourth signals in response to logic levels of the first and second signals. In some embodiments, the phase detector includes a first combinatorial logic gate adapted to receive the first and second signals and generate the third signal, and a second combinatorial logic gate adapted to receive the first signal and an inverse of the second signal and generate the fourth signal. Each of the first and second logic gates may be an AND gate further adapted to receive an enabling signal.

In some embodiments, the phase detector includes, in part, sequential logic gates, such as flip-flops gates. In these embodiments, the phase detector generates the third and fourth signals in response to transitions of the first and second signals.

DETAILED DESCRIPTION OF THE INVENTION

Figure 6:
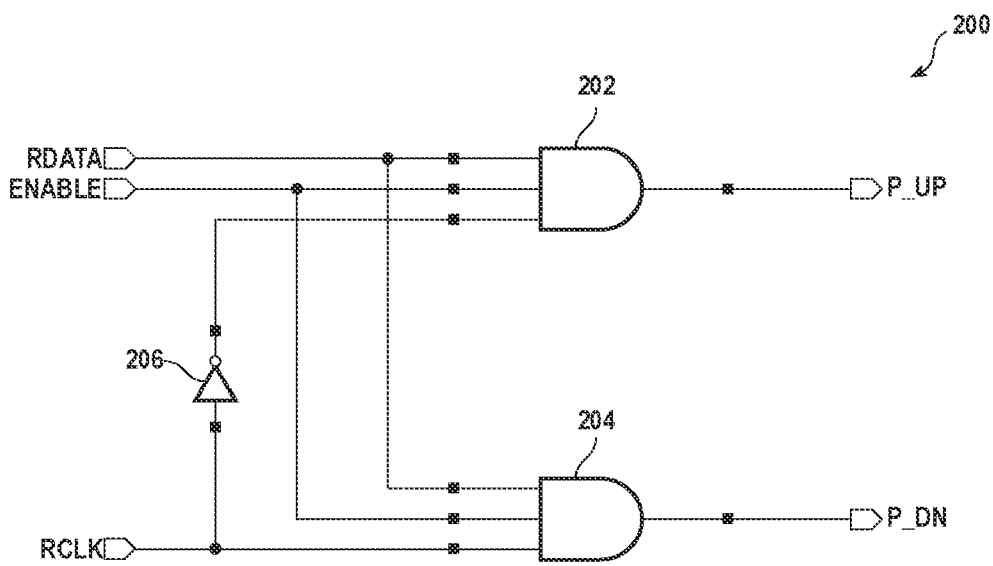
FIG. 6 shows a phase detector, in accordance with one exemplary embodiment of the present invention.

FIG. 6 is a schematic diagram of a phase detector 200 adapted to detect the phase of data signal Rdata relative to the phase of signal Rclk where the pulse width of signal Rdata is smaller than one half period of the clock, in accordance with one exemplary embodiment of the present invention. Phase detector 200 is shown as including combinatorial logic gates, namely AND gates 202, 204 and inverter 206. Signal Rdata is applied to input terminals of both AND gates 202, and 204. Signal Rclk is applied to an input terminal of AND gate 204. Inverse of signal Rclk is applied to an input terminal of AND gate 202. Signal Enable is also applied to an input terminal of each AND gates 202, and 204. AND gate 202 generates output signal P_UP, and AND gate 204 generates output signal P_DN. Signals P_UP an P_DN are generated in response to the logic levels of signals Rdata and Rclk.

Signal Enable is used to enable or to disable phase detector 200. Accordingly, when signal Enable is, e.g., in a logic high state, phase detector 200 is enabled, and when signal Enable is, e.g., in a logic low state, phase detector 200 is disabled.

Figure 1:
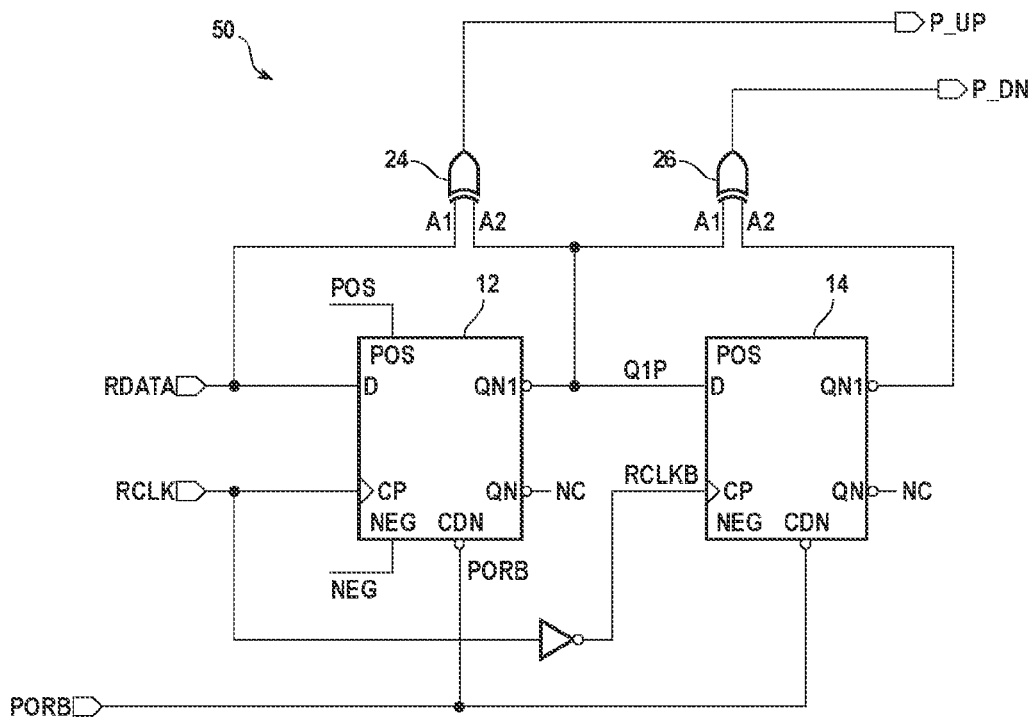
FIG. 1 is a simplified block diagram of a Hogge phase detector, as known in the prior art.
Figure 2:
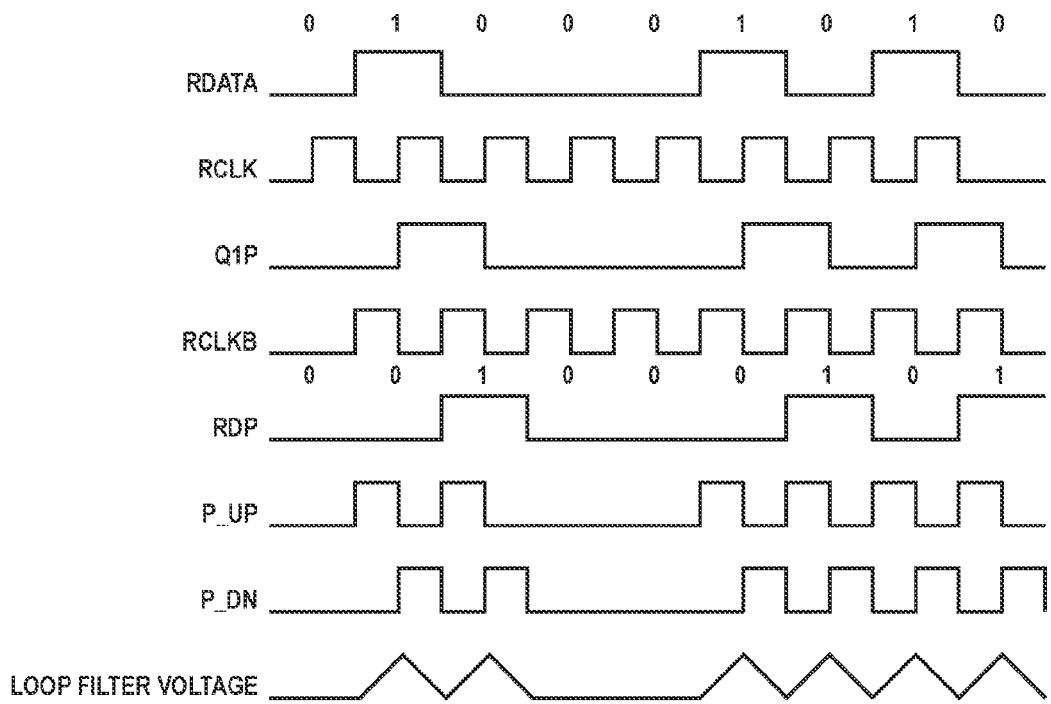
FIG. 2 is a timing diagram of various signals as the phase detector of FIG. 1 receives NRZ data or PWM data stream.
Figure 3:
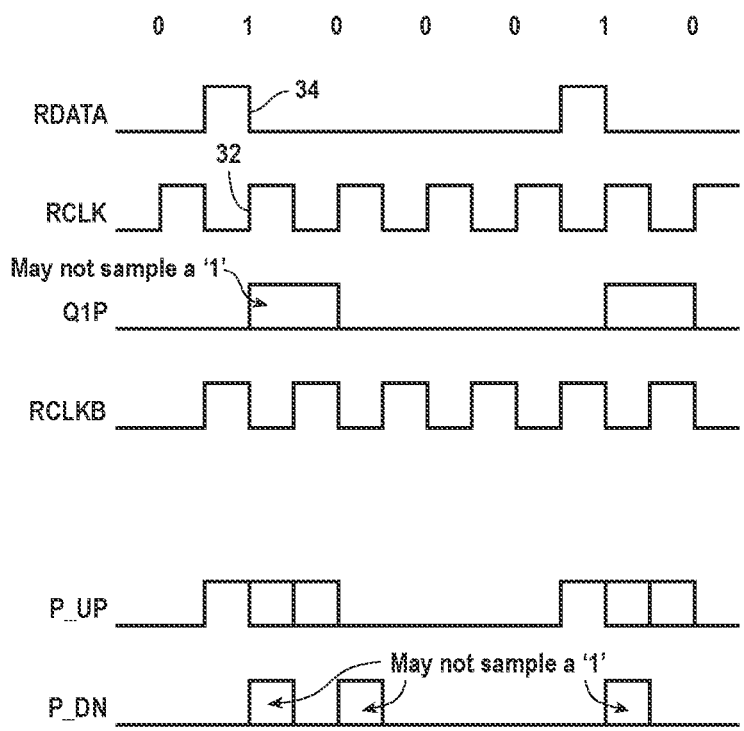
FIG. 3 is a timing diagram of various signals as the phase detector of FIG. 1 receives RZ data stream.
Figure 4:
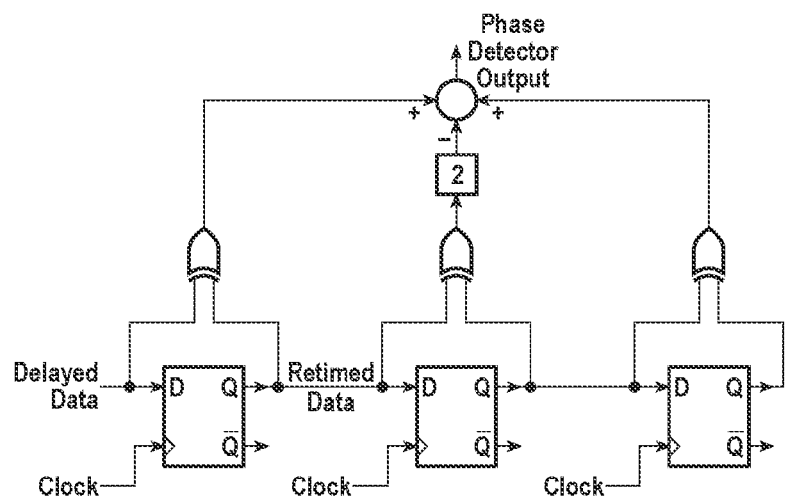
FIGS. 4 and 5 show tri-wave phase detectors, as known in the prior art.
Figure 5:
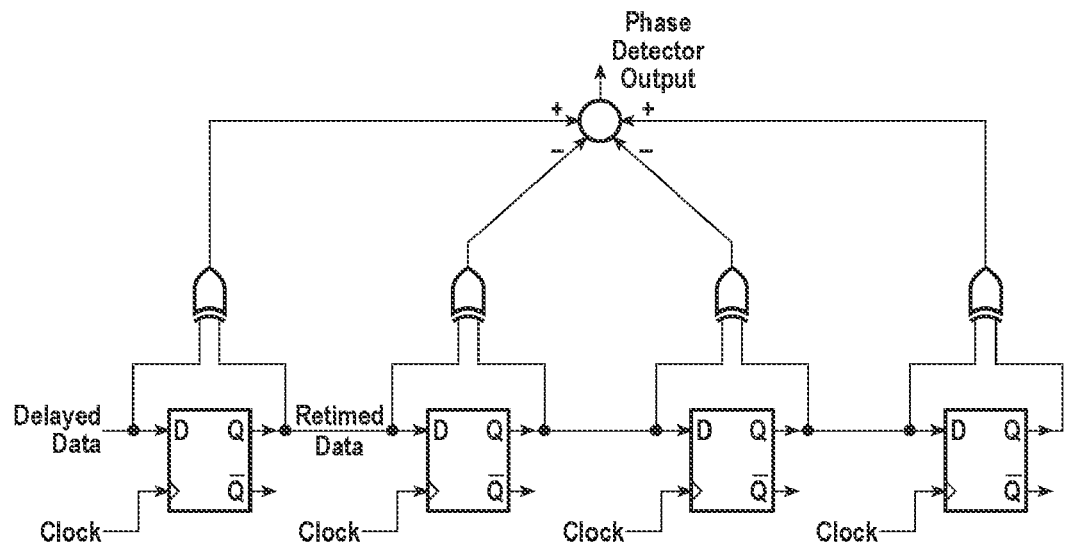
Figure 7:
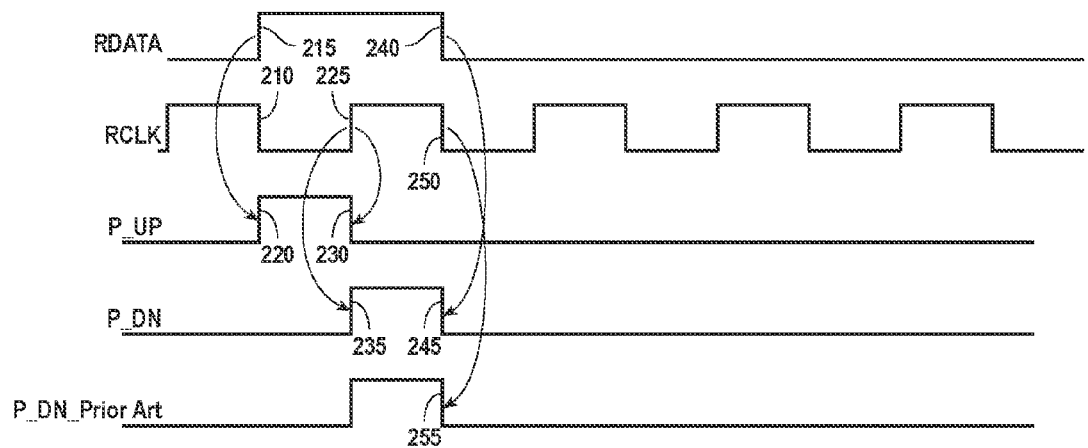
FIG. 7 shows an exemplary timing diagram of signals associated with the phase detector of FIG. 6.

FIG. 7 shows a timing diagram of some of the signals received by or generated by phase detector 200, when signals Rdata and Rclk are in-lock, in accordance with one exemplary embodiment. As seen from this timing diagram, assuming clock signal Rclk is in a logic low state (e.g., due to high-to-low transition 210) after signal Rdata transitions to a high logic state (becomes high) 215, signal PULP also goes high 220. Thereafter, when signal Rclk goes high 225, signal P_UP goes low 230, and signal P_DN goes high 235. Signal P_DN remains high until signal Rdata goes low 240, thereby causing signal P_DN to go low 245. In conventional Hogge type phase detectors, such as that shown in FIG. 1, the high-to-low transition 255 of a signal corresponding to signal P_DN (shown in FIG. 7 as signal P_DN_PriorArt) occurs in response to high-to-low transition 250 of signal Rclk. However, in accordance with the present invention, the high-to-low transition 245 of signal P_DN occurs in response to high-to-low transition 240 of signal Rdata.

Figure 8:
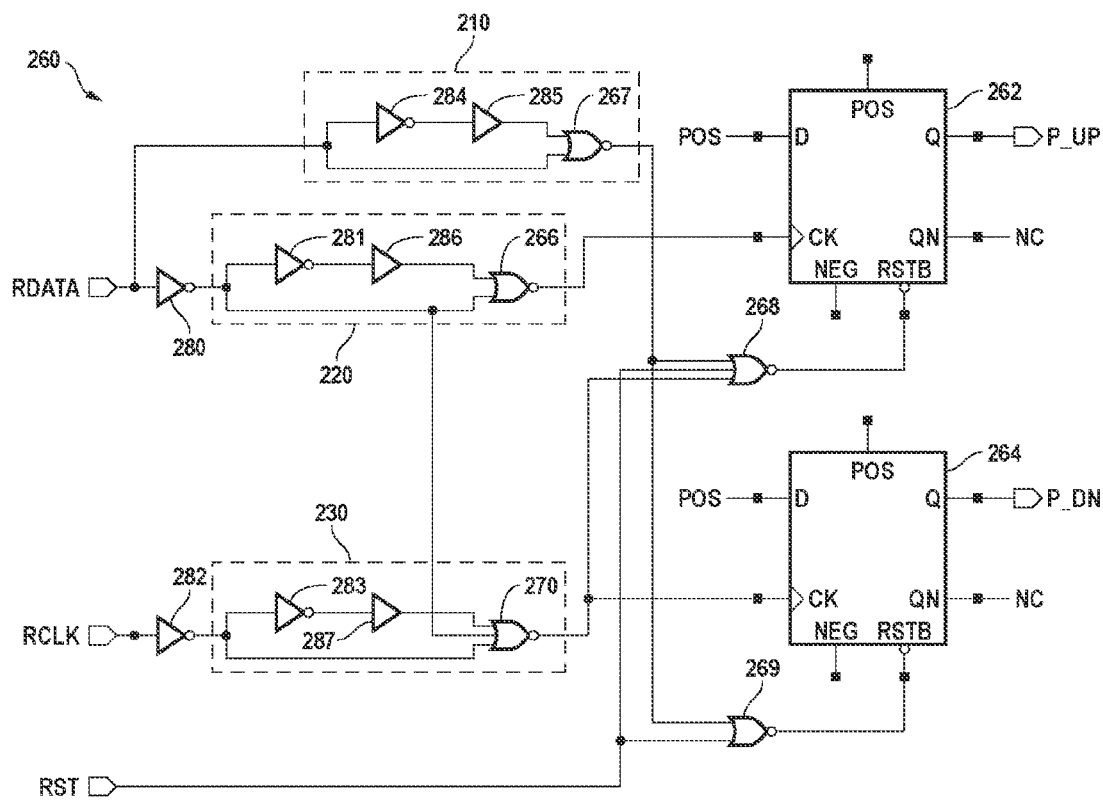
FIG. 8 shows a phase detector, in accordance with another exemplary embodiment of the present invention.

FIG. 8 is a schematic diagram of a phase detector 260 adapted to detect the phase of data signal Rdata relative to the phase of signal Rclk, in accordance with another exemplary embodiment of the present invention. Phase detector 260 is shown as including sequential logic gates, namely flip-flops 262, 264, as well as combinatorial logic gates, namely NOR gates 266, 267, 268, 269, 270, and inverters 280, 281, 282, 283, 284, and three delay buffers 285, 286, 287.

There are three pulse generators 210, 220 and 230. Pulse generator 210 includes inverter 284, delay buffer 285 and NOR gate 267 whose output drives one of the input terminals of NOR gates 268 and 269. Pulse generator 220 includes inverter 281, delay buffer 286 and NOR gate 266 whose output drives the CK clock input terminal of flip-flop 262. Pulse generator 230 includes inverter 283, delay buffer 287 and NOR gate 270 whose output drives the CK clock input terminal of flip-flop 264 and input terminal of NOR gate 268. Pulse generator 230 is adapted to output pulses if signal RDATA signal is at high logic level.

There are three conditions in which NOR gate 268 resets flip-flop 262: The first condition occurs whenever RDATA signal makes a logic high to low. The second condition occurs when signal RCLK signal makes a logic low to high transition. The negative transition of signal RDATA also resets the flip-flop 264 via NOR gate 269. The third condition occurs when signal RST resets both flip-flops 262 and 264 via NOR gates 268 and 269 respectively.

The first flip-flop 262 is set whenever signal RDATA makes a low to high transition via the inverter gate 280 and pulse generator 220. The second flip-flop 264 is set only when signal RCLK makes a low to high transition and signal RDATA is asserted via inverter 282 and pulse generator 230.

Figure 9:
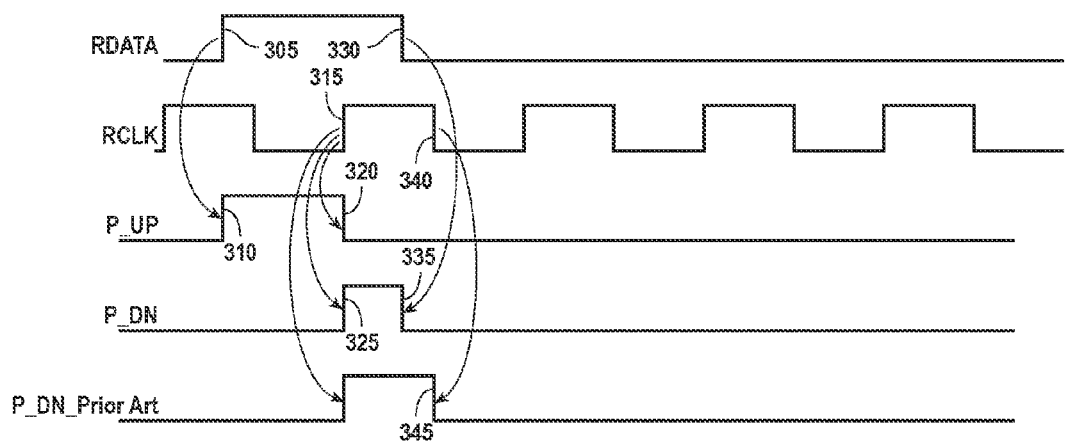
FIG. 9 shows an exemplary timing diagram of signals associated with the phase detector of FIG. 8.

FIG. 9 shows an exemplary timing diagram of some of the signals received by or generated by phase detector 260, when signal Rdata lead signals and Rclk. As seen from this timing diagram, when signal Rdata goes high 305, signal P_UP also goes high 310. Signal P_UP remains high until signal Rclk goes high 315 to reset flip-flop 262, thereby causing signal P_UP to go low 320. Also, in response to the low-to-high transition 315 of signal Rclk, signal P_DN makes a low-to-high transition 325. Signal P_DN remains in a high states until signal RDATA goes from high to low 330 to reset flip-flop 264, thereby causing signal P_DN to go low 335. In conventional Hogge type phase detectors, such as that shown in FIG. 1, the high-to-low transition 345 of a signal corresponding to signal P_DN (shown in FIG. 8 as signal P_DN_P-riorArt) occurs in response to a high-to-low transition 340 of signal Rclk. However, in accordance with the present invention, the high-to-low transition 335 of signal P_DN occurs in response to high-to-low transition 330 of signal Rdata.

Figure 10:
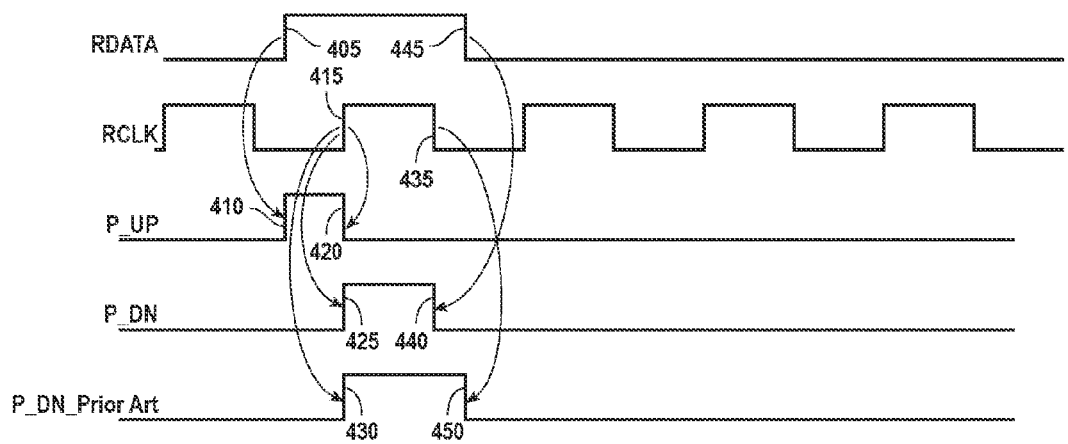
FIG. 10 shows an exemplary timing diagram of signals associated with the phase detector of FIG. 8.

FIG. 10 shows another exemplary timing diagram of some of the signals received by or generated by phase detector 260, when signals Rdata lags signals and Rclk. As seen from this timing diagram, when signal Rdata goes high 405, signal P_UP also goes high 410. Signal P_UP remains high until signal Rclk makes a low-to-high transition 415 to reset flip-flop 262, thereby causing signal P_UP to go low 420. Also, in response to the low-to-high transition 415 of signal Rclk, signal P_DN makes a low-to-high transition 425. Signal P_DN remains in a high states until signal Rdata goes from high to low 445, at which point signal P_DN goes low 440. In conventional Hogge type phase detectors, such as that shown in FIG. 1, the high-to-low transition 450 of a signal corresponding to signal P_DN (shown in FIG. 10 as signal P_DN_PriorArt) occurs in response to high-to-low transition 435 of signal Rclk. However, in accordance with the present invention, the high-to-low transition 440 of signal P_DN occurs in response to high-to-low transition 445 of signal Rdata.

Unlike the prior art phase detectors which cause signal P_DN to become inactive when signal Rclk becomes inactive (e.g., when signal Rclk transitions from high to low), a phase detector in accordance with the present invention, causes signal P_DN to become inactive (e.g., from active high to inactive low) in response to transitions (e.g. from active high to inactive low level) of data signal Rdata. Accordingly, a phase detector in accordance with the present invention, causes transitions from the inactive levels (e.g., low) to the active levels (e.g., high) of signal Rclk to be positioned nearly at the center of the transitions of signal Rdata for RZ or pulse-position modulation data. Accordingly, a phase detector in accordance with the present invention, is immune to dependency of the duty cycle of the received clock signal and thus is adapted to restore the 50% duty cycle of the clock.

The present invention is adapted to be operative even in the absence of setup or hold times between the RDATA and RCLK signals. The present invention is further operative to detect phase differences if the pulse width of input signal RDATA signal is less than two periods of the clock. As is known, RZ or PPM data stream do not have pulse widths that are equal or longer than two periods of the clock.

Figure 11A:
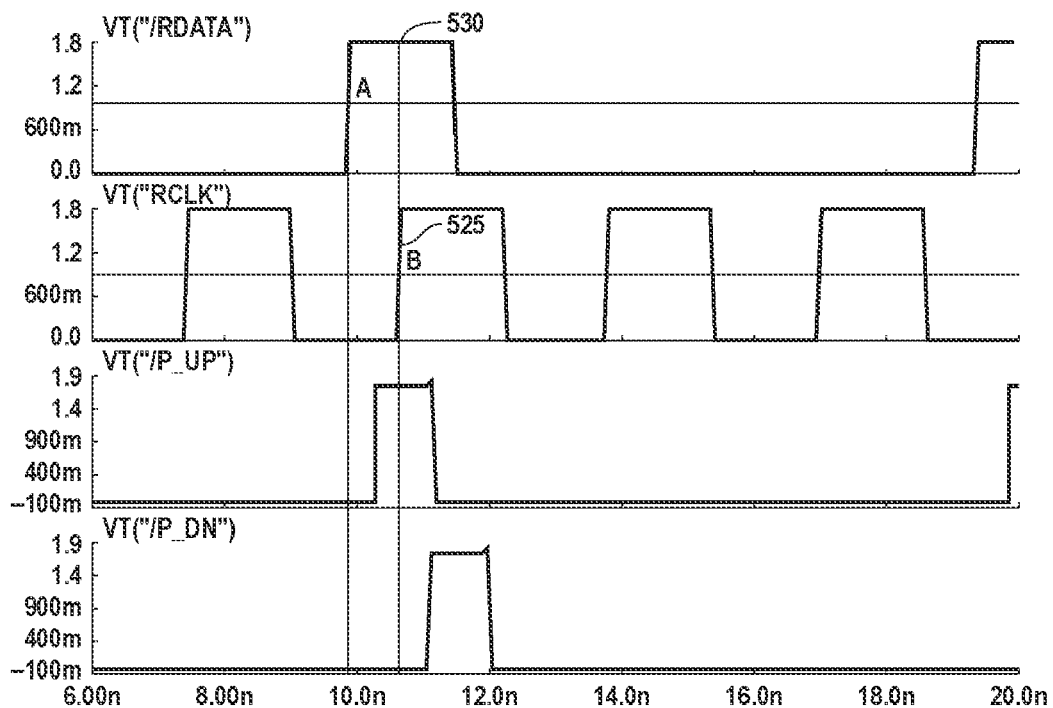
FIG. 11A-11C are exemplary timing diagrams of a number of signals associated with the phase detector of FIG. 8.
Figure 11B:
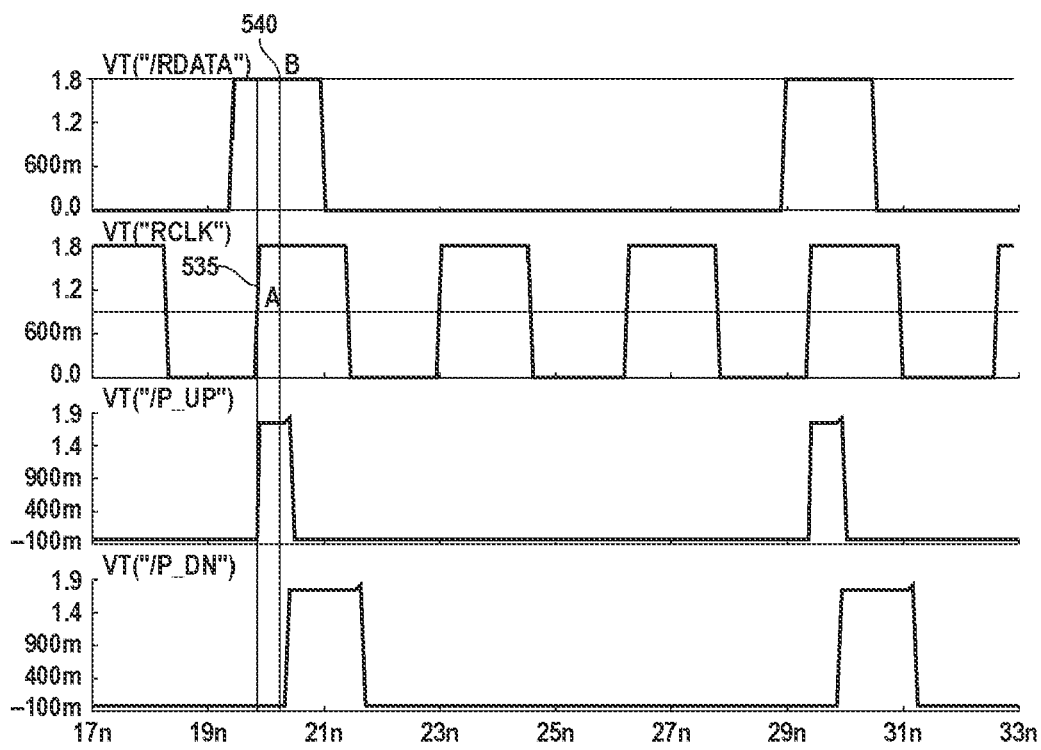
Figure 11C:
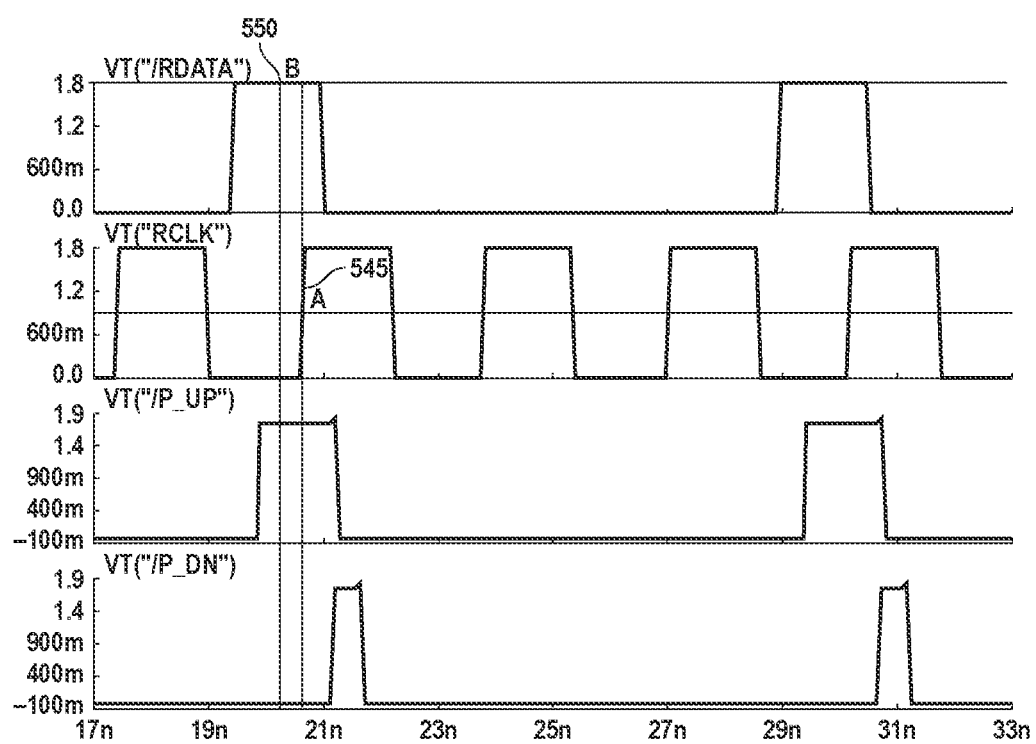

FIG. 11A shows that transition 525 on signal Rclk of phase detector 500 occurs near the center 530 of signal A. Accordingly, signals P_UP and P_DN generated by phase detector 500 have the same pulse width. FIG. 11B shows that transition 535 on signal Rclk of phase detector 500 occurs prior to the center 530 of signal A. Accordingly, signal P_UP generated by phase detector 500 has a smaller pulse width than signal P_DN. FIG. 11C shows that transition 545 on signal Rclk of phase detector 500 occurs after to the center 550 of signal A. Accordingly, signal P_UP generated by phase detector 500 has a greater pulse width than signal P_DN.

The above embodiments of the present invention are illustrative and not limitative. The invention is not limited by any particular arrangement of logic gates used to generate the phase signals. The invention is not limited by the logic level with which defines whether a signal is active or inactive. Thus, in some embodiments, a high logic level may be an active level while in other embodiments, a low logic level may be an active level. The invention is not limited by any particular combinatorial or sequential logic. Other additions, subtractions or modification are obvious in view of the present invention and are intended to fall within the scope of the appended claims.

What is claimed is:

1. A phase detector comprising;
    a first pulse generator responsive to a data signal;
    a first flip-flop having a clock terminal responsive to an output of the first pulse generator; said first flip-flop having a data terminal coupled to a first voltage;
    a second pulse generator responsive to a clock signal; and
    a second flip-flop having a clock terminal responsive to an output of the second pulse generator; said second flip-flop having a data terminal coupled to the first voltage;
    a third pulse generator responsive to said data signal, wherein a reset terminal of the first flip-flop is responsive to an output of the second pulse generator, wherein the reset terminal of each of the first and second flip-flops is further responsive to an output of the second pulse generator, wherein the reset terminal of each of the first and second flip-flops is further responsive to a reset signal, wherein each of said first, second and third pulse generators comprises a first logic block performing an inverse operation, a second logic block performing a delay operation, and a third logic block performing a NOR operation.

2. The phase detector of claim 1 wherein said first voltage is a supply voltage.

* * * * *